United States Patent
Hoogendam et al.

(10) Patent No.: US 8,810,771 B2
(45) Date of Patent: *Aug. 19, 2014

(54) LITHOGRAPHIC APPARATUS AND DEVICE MANUFACTURING METHOD

(75) Inventors: Christiaan Alexander Hoogendam, Veldhoven (NL); Erik Roelof Loopstra, Eindhoven (NL); Bob Streefkerk, Tilburg (NL); Bernhard Gellrich, Aalen (DE); Andreas Wurmbrand, Aalen-Reichenbach (DE)

(73) Assignees: ASML Netherlands B.V., Veldhoven (NL); Carl Zeiss SMT AG, Oberkochen (DE)

( * ) Notice: Subject to any disclaimer, the term of this patent is extended or adjusted under 35 U.S.C. 154(b) by 205 days.

This patent is subject to a terminal disclaimer.

(21) Appl. No.: 13/323,404

(22) Filed: Dec. 12, 2011

(65) Prior Publication Data

US 2012/0086926 A1   Apr. 12, 2012

Related U.S. Application Data

(63) Continuation of application No. 12/422,140, filed on Apr. 10, 2009, now Pat. No. 8,102,502, which is a continuation of application No. 12/010,705, filed on Jan. 29, 2008, now Pat. No. 7,532,304, which is a continuation of application No. 10/961,395, filed on Oct. 12, 2004, now Pat. No. 7,352,433.

(30) Foreign Application Priority Data

Oct. 28, 2003   (EP) .................................... 03256809

(51) Int. Cl.
*G03B 27/52*   (2006.01)
*G03B 27/42*   (2006.01)

(52) U.S. Cl.
USPC .............................................. 355/30; 355/53

(58) Field of Classification Search
CPC ............ G03F 7/70341; G03F 7/70358; G03F 7/70908
USPC ............... 355/30, 53; 378/34; 250/548, 492.2
See application file for complete search history.

(56) References Cited

U.S. PATENT DOCUMENTS

| 3,573,975 A | 4/1971 | Dhaka et al. |
| 3,648,587 A | 3/1972 | Stevens |

(Continued)

FOREIGN PATENT DOCUMENTS

| DE | 206 607 | 2/1984 |
| DE | 221 563 | 4/1985 |

(Continued)

OTHER PUBLICATIONS

M. Switkes et al., "Immersion Lithography at 157 nm", MIT Lincoln Lab, Orlando 2001-1, Dec. 17, 2001.

(Continued)

*Primary Examiner* — Peter B Kim
(74) *Attorney, Agent, or Firm* — Pillsbury Winthrop Shaw Pittman LLP

(57) ABSTRACT

Liquid is supplied to a space between the projection system of a lithographic apparatus and a substrate. A flow of gas towards a vacuum inlet prevents the humid gas from escaping to other parts of the lithographic apparatus. This may help to protect intricate parts of the lithographic apparatus from being damaged by the presence of humid gas.

20 Claims, 2 Drawing Sheets

(56) References Cited

U.S. PATENT DOCUMENTS

| | | | |
|---|---|---|---|
| 4,346,164 | A | 8/1982 | Tabarelli et al. |
| 4,390,273 | A | 6/1983 | Loebach et al. |
| 4,396,705 | A | 8/1983 | Akeyama et al. |
| 4,480,910 | A | 11/1984 | Takanashi et al. |
| 4,509,852 | A | 4/1985 | Tabarelli et al. |
| 4,704,348 | A | 11/1987 | Koizumi et al. |
| 4,998,821 | A | 3/1991 | Ohta et al. |
| 5,040,020 | A | 8/1991 | Rauschenbach et al. |
| 5,610,683 | A | 3/1997 | Takahashi |
| 5,715,039 | A | 2/1998 | Fukuda et al. |
| 5,825,043 | A | 10/1998 | Suwa |
| 5,900,354 | A | 5/1999 | Batchelder |
| 5,997,963 | A | 12/1999 | Davidson et al. |
| 6,191,429 | B1 | 2/2001 | Suwa |
| 6,236,634 | B1 | 5/2001 | Lee et al. |
| 6,555,834 | B1 | 4/2003 | Loopstra |
| 6,560,032 | B2 | 5/2003 | Hatano |
| 6,600,547 | B2 | 7/2003 | Watson et al. |
| 6,603,130 | B1 | 8/2003 | Bisschops et al. |
| 6,633,365 | B2 | 10/2003 | Suenaga |
| 7,075,616 | B2 | 7/2006 | Derksen et al. |
| 7,098,991 | B2 | 8/2006 | Nagasaka et al. |
| 7,352,433 | B2 * | 4/2008 | Hoogendam et al. ........... 355/30 |
| 7,532,304 | B2 * | 5/2009 | Hoogendam et al. ........... 355/30 |
| 2001/0038442 | A1 | 11/2001 | Hansell et al. |
| 2002/0020821 | A1 | 2/2002 | Van Santen et al. |
| 2002/0163629 | A1 | 11/2002 | Switkes et al. |
| 2003/0030916 | A1 | 2/2003 | Suenaga |
| 2003/0123040 | A1 | 7/2003 | Almogy |
| 2003/0123042 | A1 | 7/2003 | Laganza et al. |
| 2003/0146396 | A1 | 8/2003 | Loopstra et al. |
| 2003/0174408 | A1 | 9/2003 | Rostalski et al. |
| 2004/0000627 | A1 | 1/2004 | Schuster |
| 2004/0021844 | A1 | 2/2004 | Suenaga |
| 2004/0075895 | A1 | 4/2004 | Lin |
| 2004/0109237 | A1 | 6/2004 | Epple et al. |
| 2004/0114117 | A1 | 6/2004 | Bleeker |
| 2004/0118184 | A1 | 6/2004 | Violette |
| 2004/0119954 | A1 | 6/2004 | Kawashima et al. |
| 2004/0125351 | A1 | 7/2004 | Krautschik |
| 2004/0136494 | A1 | 7/2004 | Lof et al. |
| 2004/0160582 | A1 | 8/2004 | Lof et al. |
| 2004/0165159 | A1 | 8/2004 | Lof et al. |
| 2004/0169834 | A1 | 9/2004 | Richter et al. |
| 2004/0169924 | A1 | 9/2004 | Flagello et al. |
| 2004/0180294 | A1 | 9/2004 | Baba-Ali et al. |
| 2004/0180299 | A1 | 9/2004 | Rolland et al. |
| 2004/0207824 | A1 | 10/2004 | Lof et al. |
| 2004/0211920 | A1 | 10/2004 | Derksen et al. |
| 2004/0224265 | A1 | 11/2004 | Endo et al. |
| 2004/0224525 | A1 | 11/2004 | Endo et al. |
| 2004/0227923 | A1 | 11/2004 | Flagello et al. |
| 2004/0233401 | A1 | 11/2004 | Irie |
| 2004/0253547 | A1 | 12/2004 | Endo et al. |
| 2004/0253548 | A1 | 12/2004 | Endo et al. |
| 2004/0257544 | A1 | 12/2004 | Vogel et al. |
| 2004/0259008 | A1 | 12/2004 | Endo et al. |
| 2004/0259040 | A1 | 12/2004 | Endo et al. |
| 2004/0263808 | A1 | 12/2004 | Sewell |
| 2005/0018155 | A1 | 1/2005 | Cox et al. |
| 2005/0018156 | A1 | 1/2005 | Mulkens et al. |
| 2005/0030506 | A1 | 2/2005 | Schuster |
| 2005/0036121 | A1 | 2/2005 | Hoogendam et al. |
| 2005/0036183 | A1 | 2/2005 | Yeo et al. |
| 2005/0036184 | A1 | 2/2005 | Yeo et al. |
| 2005/0036213 | A1 | 2/2005 | Mann et al. |
| 2005/0037269 | A1 | 2/2005 | Levinson |
| 2005/0046934 | A1 | 3/2005 | Ho et al. |
| 2005/0048223 | A1 | 3/2005 | Pawloski et al. |
| 2005/0068639 | A1 | 3/2005 | Pierrat et al. |
| 2005/0073670 | A1 | 4/2005 | Carroll |
| 2005/0084794 | A1 | 4/2005 | Meagley et al. |
| 2005/0094114 | A1 | 5/2005 | Streefkerk et al. |
| 2005/0094116 | A1 | 5/2005 | Flagello et al. |
| 2005/0100745 | A1 | 5/2005 | Lin et al. |
| 2005/0110973 | A1 | 5/2005 | Streefkerk et al. |
| 2005/0117224 | A1 | 6/2005 | Shafer et al. |
| 2005/0122497 | A1 | 6/2005 | Lyons et al. |
| 2005/0128445 | A1 | 6/2005 | Hoogendam et al. |
| 2005/0134817 | A1 | 6/2005 | Nakamura |
| 2005/0141098 | A1 | 6/2005 | Schuster |
| 2005/0190455 | A1 | 9/2005 | Rostalski et al. |
| 2005/0217135 | A1 | 10/2005 | O'Donnell et al. |
| 2005/0217137 | A1 | 10/2005 | Smith et al. |
| 2005/0217703 | A1 | 10/2005 | O'Donnell |
| 2005/0259234 | A1 | 11/2005 | Hirukawa et al. |
| 2006/0012765 | A1 | 1/2006 | Kameyama |
| 2006/0023184 | A1 | 2/2006 | Coon et al. |
| 2006/0028632 | A1 | 2/2006 | Hazelton et al. |
| 2006/0114445 | A1 | 6/2006 | Ebihara |
| 2006/0261288 | A1 | 11/2006 | Van Santen |

FOREIGN PATENT DOCUMENTS

| | | |
|---|---|---|
| DE | 224448 | 7/1985 |
| DE | 242880 | 2/1987 |
| EP | 0023231 | 2/1981 |
| EP | 0418427 | 3/1991 |
| EP | 0 834 773 A2 | 4/1998 |
| EP | 1039511 | 9/2000 |
| EP | 1420298 A2 | 10/2003 |
| FR | 2474708 | 7/1981 |
| JP | A 57-153433 | 9/1982 |
| JP | 58-202448 | 11/1983 |
| JP | A 59-19912 | 2/1984 |
| JP | S59-19912 | 2/1984 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | A 5-62877 | 3/1993 |
| JP | A 5-304072 | 11/1993 |
| JP | H06-78192 | 3/1994 |
| JP | 06-124873 | 5/1994 |
| JP | 07-132262 | 5/1995 |
| JP | 07-220990 | 8/1995 |
| JP | A 8-316125 | 11/1996 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| JP | 2011-044736 | 3/2011 |
| WO | 0 605 103 A1 | 7/1994 |
| WO | WO 99/49504 | 9/1999 |
| WO | WO 02/091078 A1 | 11/2002 |
| WO | WO 03/077034 A2 | 9/2003 |
| WO | WO 03/077036 | 9/2003 |
| WO | WO 03/077037 | 9/2003 |
| WO | WO 03/085708 A1 | 10/2003 |
| WO | WO 2004/019128 | 3/2004 |
| WO | 2004/053955 | 6/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | 2004/086470 | 10/2004 |
| WO | WO 2004/090577 A2 | 10/2004 |

(56) References Cited

FOREIGN PATENT DOCUMENTS

| WO | WO 2004/090633 A2 | 10/2004 |
|---|---|---|
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2005/001432 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/054953 A2 | 6/2005 |
| WO | WO 2005/054955 A2 | 6/2005 |
| WO | WO 2005/062128 A2 | 7/2005 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths to Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future Fab International, vol. 15, Jul. 11, 2003.

H. Kawata et al., "Fabrication of 0.2μm Fine Patterns Using Optical Projection Lithography with an Oil Immersion Lens", Jpn. J. Appl. Phys. vol. 31 (1992), pp. 4174-4177.

G. Owen et al., "1/8μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pgs. 1-3.

S. Owa and N. Nagasaka, "Potential Performance and Feasibility of Immersion Lithography", NGL Workshop 2003, Jul. 10, 2003, Slide Nos. 1-33.

Preliminary Amendment filed Jun. 15, 2006 for U.S. Appl. No. 11/339,505.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $k_3$ coefficient in nonparaxial λ/NA scaling equations for resolution, depth of focus, and immersion lithography, *J. Microlith., Microfab., Microsyst.* 1(1):7-12 (2002).

Search Report for European Application No. 03256809.9, dated Sep. 13, 2004.

Search Report for European Application No. 04256584.6 -1226, dated Feb. 14, 2006.

Chinese Official Action issued on Apr. 4, 2008 in Chinese Application No. 200410087957.0.

Office Action dated Feb. 20, 2007 issued for U.S. Appl. No. 11/339,505.

U.S. Office Action dated Oct. 7, 2013 in corresponding U.S. Appl. No. 13/356,231.

* cited by examiner

LITHOGRAPHIC APPARATUS AND DEVICE MANUFACTURING METHOD

This application is a continuation of co-pending U.S. patent application Ser. No. 12/422,140, filed Apr. 10, 2009, now allowed, which is a continuation of U.S. patent application Ser. No. 12/010,705, filed Jan. 29, 2008, now U.S. Pat. No. 7,532,304, which is a continuation of U.S. patent application Ser. No. 10/961,395, filed Oct. 12, 2004, now U.S. Pat. No. 7,352,433, which claims priority to European patent application EP 03256809.9, filed Oct. 28, 2003, each application is incorporated herein in its entirety.

FIELD

The present invention relates to a lithographic apparatus and a device manufacturing method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.)

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

SUMMARY

The presence of liquid in a lithography apparatus results in the surrounding gas (e.g., air) becoming very humid. Humidity levels of up to 100% are possible. Moisture in the gas can enter other parts of the lithography apparatus thus contaminating other machine pacts and measurement components so the operation and accurate measurement of the lithography apparatus may become compromised. The moisture in the gas may cause rusting of machine parts and therefore may reduce the life span of the lithography apparatus.

Accordingly, it would be advantageous, for example, to provide a method of confining and/or removing humid gas.

According to an aspect of the invention, there is provided a lithographic apparatus, comprising:

an illumination system configured to condition beam of radiation;

a support structure configured to hold a patterning device, the patterning device configured to pattern the beam of radiation according to a desired pattern;

a substrate table configured to hold a substrate;

a projection system configured to project the patterned beam onto a target portion of the substrate;

a liquid supply system configured to at least partly fill a space between the projection system and the substrate with a liquid; and a gas flow port configured to create a flow of gas to remove humid gas in a space above and in contact with the liquid, to confine the humid gas in the space, or both.

The humid gas above (where down is the direction of propagation of the projection beam) the liquid may thus be confined to or removed from a small volume relative to the projection apparatus. In an embodiment, there may be no rigid connection between parts of the apparatus so relative movement between the parts of the apparatus may occur freely. The gas used should be clean and dry to avoid damage to the apparatus and to absorb the humidity.

In an embodiment, the gas flow port comprises a vacuum inlet, which may also remove a contaminant from the system. The contaminant removed can be solid particles (which could damage the apparatus by scratching it), liquid particles or gaseous particles other than the gas itself. The vacuum inlet may be annular shaped, the projection system being arranged at the center of the annulus.

In an embodiment, the gas flow port comprises a passage through which the flow of gas flows. The passage bounds the volume of humid gas and the clean, dry gas flowing through the passage helps to prevent the humid gas from escaping. The passage may be formed at least partly by a part of the projection system and the gas flow port.

The lithographic apparatus may further comprise a cover, the cover forming a part of the passage, the cover being joined to the projection system by a seal. The cover may thus provides a gastight cover to the projection system, helping to prevent humid gas from entering the projection system or the remainder of the lithographic apparatus. The seal should be flexible and is, in an embodiment, a glue. Relative movement between parts of the lithographic apparatus may therefore not be compromised.

The liquid supply system may comprise a liquid confinement structure extending along at least part of the boundary of a space between the projection system and the substrate. In an embodiment, the gas flow port is arranged so that a flow of gas is provided at least partly between the liquid confinement structure and the projection system. Due to the presence of the gas flow port, relative movement between the liquid confinement structure and the projection system may take place. In an embodiment, the lithographic apparatus is arranged so that the gas flow port is arranged between the projection system and the liquid confinement structure. The liquid confinement structure optionally comprises a gas seal inlet configured to form a gas seal between the liquid confinement structure and a surface of the substrate. Humid gas is therefore confined by the substrate, the gas seal inlet, the liquid confinement structure, the gas flow port and the projection system. In an embodiment, the liquid confinement structure is mounted onto a base frame of the lithographic projection apparatus. In an embodiment, the liquid confinement structure is movable relative to the base frame in the Z, Rx and Ry directions (where the Z direction is the direction of propagation of the projection beam) but fixed in all other directions.

According to a further aspect of the invention, there is provided a device manufacturing method, comprising:

providing a liquid to a space between a projection system and a substrate;

flowing a gas in a space above and in contact the liquid to remove humid gas in the space, to confine the humid gas in the space, or both; and projecting a patterned beam of radiation using the projection system onto a target portion of the substrate through the liquid.

An embodiment of the invention easily may be used with the liquid supply system illustrated in FIGS. 2 and 3. Additional inlets and outlets arranged in a space above the liquid in those Figures would generate a gas flow which could absorb the humid gas from or confine the humid gas in the gaseous space above the liquid.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm).

The term "patterning device" used herein should be broadly interpreted as referring to any device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of a patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the projection beam of radiation.

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
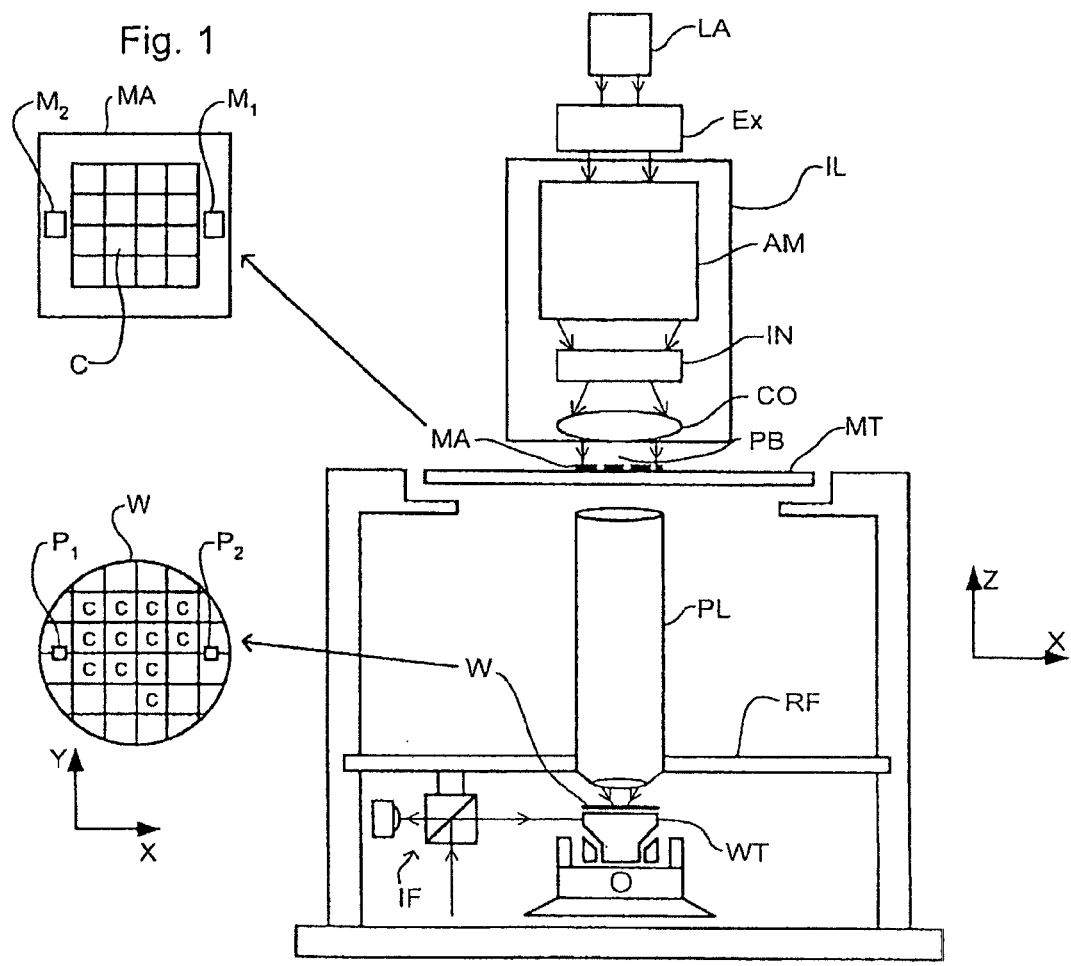
FIG. 1 depicts a lithographic apparatus according to an embodiment of the invention.

FIG. 1 schematically depicts a lithographic apparatus according to a particular embodiment of the invention. The apparatus comprises:

an illumination system (illuminator) IL configured to provide a projection beam PB of radiation (e.g. UV radiation).

a first support structure (e.g. a mask table) MT configured to hold a patterning device (e.g. a mask) MA and connected to a first positioner PM configured to accurately position the patterning device with respect to item PL;

a substrate table (e.g. a wafer table) WT configured to hold a substrate (e.g. a resist-coated wafer) W and connected to a second positioner PW configured to accurately position the substrate with respect to item PL; and a projection system (e.g. a refractive projection lens) PL configured to image a pattern imparted to the projection beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the projection system PL, which focuses the beam onto a target portion C of the substrate W. With the aid of the second positioner PW and position sensor IF (e.g. an interferometric device), the substrate table WT can be moved accurately, e.g. so as to position different target portions C in the path of the beam PB. Similarly, the first positioner PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioners PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable minor array of a type as referred to above.

Combinations and/or variations on the above described modes of use or entirely different modes of use may also be employed.

Another liquid supply system solution according to an embodiment of the invention is a liquid supply system with a seal member or a liquid confinement structure which extends along at least a part of a boundary of the space between the final element of the projection system and the substrate table. The seal member is substantially stationary relative to the projection system in the XY plane though there may be some relative movement in the Z direction (in the direction of the optical axis). A seal is formed between the seal member and the surface of the substrate. In an embodiment, the seal is a contactless seal such as a gas seal. Such a system is disclosed in U.S. patent application Ser. No. 10/705,783, hereby incorporated in its entirety by reference.

Figure 4:
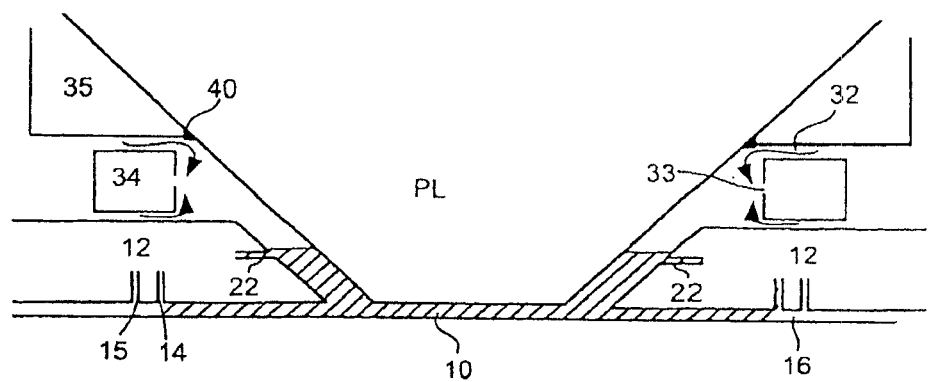
FIG. 4 is a detail of a lithographic projection apparatus according to an embodiment of the invention.

As shown in FIG. 4, a liquid reservoir 10 between the projection system and the substrate is bounded by a gas seal 16 forming an annulus around the projection system. The seal 16, in an embodiment a gas seal, is formed by gas e.g. air, synthetic air, $N_2$ or an inert gas, provided under pressure via inlet 15 to the gap between seal member 12 and the substrate and extracted via first outlet 14. The over pressure on the gas inlet 15, vacuum level on the first outlet 14 and geometry of the gap are arranged so that there is a high velocity gas flow inwards that confines the liquid. The distance between the gas inlet and outlet and substrate W is small. The liquid reservoir is supplied with liquid by inlet 22 and extends above the bottom of the final element of the projection system PL. Excess liquid is removed via outlet 14.

To prevent moisture-laden gas from pervading the entire apparatus, metal membranes may be used to confine the humid gas between the projection system and a liquid confinement structure used to at least partly contain the liquid between the projection system and the substrate. Alternatively, rubber-like Viton fluoroelastomer rings may be used to confine the gas. In such arrangements, however, it may be possible a vibration is transmitted between the projection system and the liquid confinement structure.

As shown in FIG. 4, the projection system also comprises a cover 35 attached to a main part of the projection system PL by a seal 40. The seal 40 should be flexible to accommodate small relative movement between the main part of the projection system PL and the cover 35. Glues are likely to be particularly effective. An advantage of such an arrangement is transmission of vibration forces between the projection system and the liquid confinement structure may be reduced or avoided.

A vacuum chamber 34 with an inlet 33 is arranged in the volume above the reservoir 10. The outside of the vacuum chamber 34 and cover 35 form a passage 32 along which gas flows towards vacuum chamber 34. In addition to the gas flowing along passage 32, gas from all surrounding areas will flow towards the vacuum chamber 34. The partial vapor pressure of the liquid in the gas above the reservoir 10 is high, and the flow of gas along passage 32 prevents the humid gas from entering the projection system PL.

Additionally or alternatively, the gas flow will absorb humidity from surrounding gas so there is a gradient of humidity, the humidity of the gas decreasing away from the reservoir 10. Thus delicate parts of the apparatus such as mirrors for the interferometer beams are arranged in a dry part of the apparatus so that the humidity doesn't affect measurements made using the interferometer beams. Additionally, if glue is used as seal 40, dry, flowing gas will help to ensure that the glue remains dry and therefore a gastight seal is maintained. Keeping the glue 40 dry also helps prevent it from expanding and thus generating forces which may deform the projection system.

The vacuum chamber 34 can be independent of the projection system as in the example above, or can be part of the projection system PL, or part of the seal member 12 and in any of these circumstances may be actuatable in the Z direction. There may be a plurality of gas passages 32 and vacuum chambers 34 arranged around the projection system PL, or alternatively one annular (or other) shaped vacuum chamber with a slit inlet. Although the example here is of a vacuum chamber i.e. an underpressure generating a gas flow, the gas flow port could equally comprise an overpressure.

Figure 2:
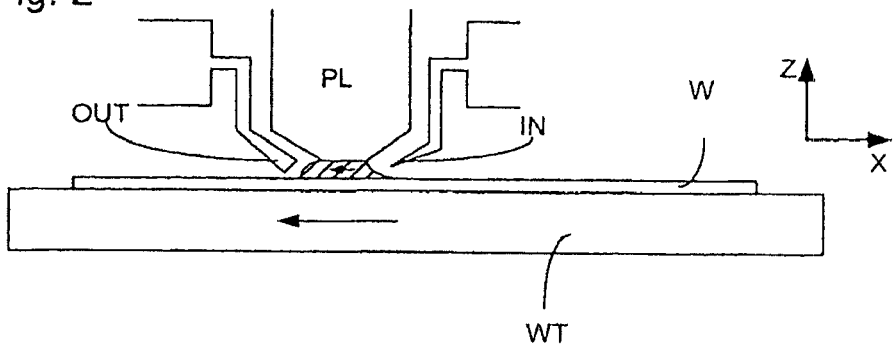
FIG. 2 depicts a liquid supply system according to an embodiment of the invention.
Figure 3:
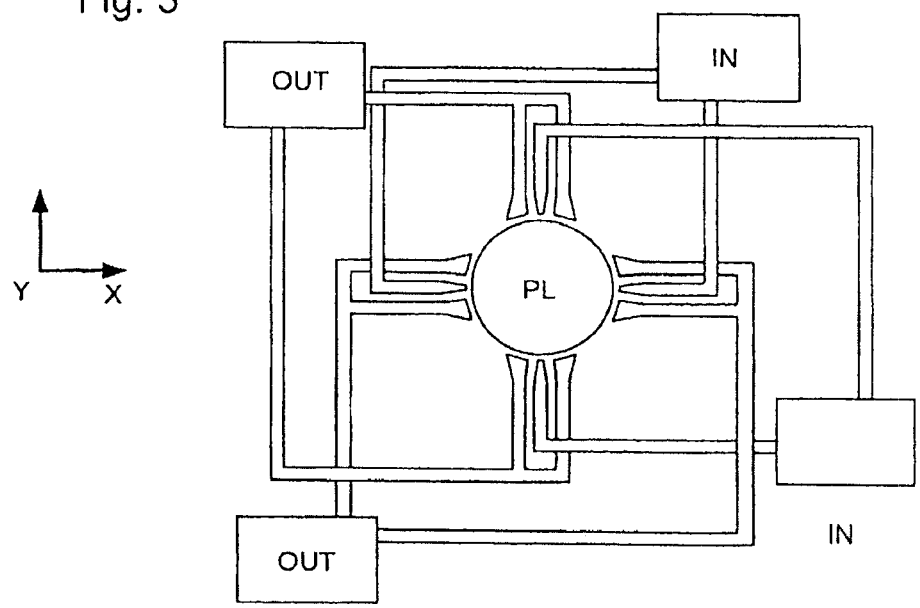
FIG. 3 is an alternative view of the liquid supply system of FIG. 2.

A system as described above may be used in conjunction with the liquid supply system shown in FIGS. 2 and 3, the vacuum chamber 34 and passage 32 being arranged above the inlets IN and outlets OUT.

In an embodiment, there is provided a lithographic apparatus, comprising: an illumination system configured to condition beam of radiation; a support structure configured to hold a patterning device, the patterning device configured to pattern the beam of radiation according to a desired pattern; a substrate table configured to hold a substrate; a projection system configured to project the patterned beam onto a target portion of the substrate; a liquid supply system configured to at least partly fill a space between the projection system and the substrate with a liquid; and a gas flow port configured to create a flow of gas to remove humid gas in a space above and in contact with the liquid, to confine the humid gas in the space, or both.

In an embodiment, the gas flow port comprises a vacuum inlet. In an embodiment, the vacuum inlet removes gas in contact with the liquid. In an embodiment, the vacuum inlet also removes a contaminant from gas in contact with the liquid. In an embodiment, the vacuum inlet has an annular shape, the projection system being arranged at the center of the annulus. In an embodiment, the gas flow port comprises a passage through which the flow of gas flows. In an embodiment, the passage is formed at least partly by the projection system and the gas flow port. In an embodiment, the apparatus further comprises a cover, the cover forming a part of the passage, the cover being joined to the projection system by a seal. In an embodiment, the seal is flexible. In an embodiment, the seal comprises glue. In an embodiment, the liquid supply system further comprises a liquid confinement structure extending along at least a part of the boundary of the space between the projection system and the substrate. In an embodiment, the gas flow port is arranged so that the flow of gas is at least partly between the liquid confinement structure and the projection system. In an embodiment, the liquid confinement structure further comprises a gas seal inlet configured to form a gas seal between the liquid confinement structure and a surface of the substrate. In an embodiment, the liquid confinement structure is mounted onto a base frame. In an embodiment, the liquid confinement structure is movable relative to the base frame in Z, Rx and Ry directions and fixed in all other directions.

In an embodiment, there is provided a device manufacturing method, comprising: providing a liquid to a space between a projection system and a substrate; flowing a gas in a space above and in contact the liquid to remove humid gas in the space, to confine the humid gas in the space, or both; and projecting a patterned beam of radiation using the projection system onto a target portion of the substrate through the liquid.

In an embodiment, the method comprises using a vacuum inlet to create the flowing gas. In an embodiment, the method comprises using the vacuum inlet to remove gas in contact with the liquid. In an embodiment, the vacuum inlet has an annular shape, the projection system being arranged at the center of the annulus. In an embodiment, the method comprises flowing the gas through a passage, the passage formed at least partly by the projection system and a device used to create the flowing gas. In an embodiment, a cover forms a part of the passage, the cover being joined to the projection system by a seal. In an embodiment, the seal is flexible. In an embodiment, providing the liquid comprises providing the liquid to the space between the projection and the substrate using a liquid confinement structure extending along at least a part of the boundary of the space between the projection system and the substrate. In an embodiment, flowing the gas comprises flowing the gas between the liquid confinement structure and the projection system. In an embodiment, the method further comprises forming a gas seal between the liquid confinement structure and a surface of the substrate. In an embodiment, the liquid confinement structure is mounted onto a base frame. In an embodiment, the liquid confinement structure is movable relative to the base frame in Z, Rx and Ry directions and fixed in all other directions.

In an embodiment, there is provided a lithographic apparatus, comprising: an illumination system configured to condition beam of radiation; a support structure configured to hold a patterning device, the patterning device configured to pattern the beam of radiation according to a desired pattern; a substrate table configured to hold a substrate; a projection system configured to project the patterned beam onto a target portion of the substrate; a liquid supply system configured to at least partly fill a space between the projection system and the substrate with a liquid; a gas flow port configured to create a flow of gas to remove humid gas in a space above and in contact with the liquid, to confine the humid gas in the space, or both; and a passage through which the flow of gas flows formed at least partly by the projection system and the gas flow port.

In an embodiment, the gas flow port comprises a vacuum inlet. In an embodiment, the vacuum inlet has an annular shape, the projection system being arranged at the center of the annulus. In an embodiment, the liquid supply system further comprises a liquid confinement structure extending along at least a part of the boundary of the space between the projection system and the substrate. In an embodiment, the gas flow port is arranged so that the flow of gas is at least partly between the liquid confinement structure and the projection system.

While specific embodiments of the invention have been described above, it will be appreciated that the invention may be practiced otherwise than as described. The description is not intended to limit the invention.

The invention claimed is:

1. A lithographic apparatus, comprising:
a substrate table configured to hold a substrate;
a projection system configured to project a patterned beam onto a target portion of the substrate;
a liquid supply system configured to at least partly fill a space between the projection system and the substrate with a liquid;
a member that is located above the substrate table and that extends along at least a part of the boundary of the space between the projection system and the substrate, the member configured to at least partly confine the liquid in the space; and
a gas inflow port separate from the body of the member and configured to create a flow of gas to at least partly confine humid gas in a volume around and in contact with the liquid in the space.

2. The apparatus according to claim 1, further comprising an underpressure inlet configured to remove gas.

3. The apparatus according to claim 2, wherein the underpressure inlet is configured to remove gas in contact with the liquid in a volume above the liquid.

4. The apparatus according to claim 2, wherein the underpressure inlet has an annular shape, the projection system arranged at the center of the annular shape.

5. The apparatus according to claim 1, further comprising a cover to cover at least part of the projection system, the cover configured to prevent humid gas from entering the projection system or the remainder of the lithographic apparatus.

6. The apparatus according to claim 5, further comprising a seal, wherein the seal is configured to seal the cover to the projection system.

7. The apparatus according to claim 5, wherein the seal is flexible.

8. The apparatus of claim 5, further comprising a passage between the member and the cover.

9. The apparatus according to claim 1, wherein the gas inflow port is arranged so that, in use, the flow of gas is at least partly between the member and the projection system.

10. The apparatus according to claim 1, wherein the member further comprises an outlet, on a bottom surface of the member, configured to remove liquid.

11. The apparatus according to claim 10, wherein the member is movable in Z, Rx and Ry directions.

12. The apparatus of claim 1, wherein the flow of gas is clean and dry gas.

13. The apparatus of claim 1, further comprising a passage that is between the member and the projection system and that is fluidly connected to the space.

14. A device manufacturing method, comprising:
providing a liquid to a space between a projection system of a lithographic apparatus and a substrate;
confining the liquid in the space at least in part by a member of the lithographic apparatus located above the substrate;
creating a flow of gas to confine humid gas in a volume around and in contact with the liquid in the space using a gas inflow port separate from the member; and
projecting a patterned beam of radiation using the projection system onto a target portion of the substrate through the liquid.

15. The method according to claim 14, comprising flowing the gas through a passage, the passage formed at least partly by the projection system and the member.

16. A lithographic apparatus, comprising:
a substrate table configured to hold a substrate;
a projection system configured to project a patterned beam onto a target portion of the substrate;
a liquid supply system configured to at least partly fill a space between the projection system and the substrate with a liquid;
a member that is located above the substrate table and that extends along at least a part of the boundary of the space between the projection system and the substrate, the member configured to at least partly confine the liquid in the space;
a gas inflow port configured to create a flow of gas to at least partly confine humid gas in a volume around and in contact with the liquid in the space; and
a gas outflow port configured to remove gas from the flow of gas.

17. The apparatus of claim 16, wherein the gas outflow port is formed in a structure separate from the projection system and the member.

18. The apparatus of claim 16, wherein the flow of gas is clean and dry gas.

19. The apparatus of claim 16, wherein the member further comprises an outlet that is on a bottom surface of the member and that is configured to remove liquid.

20. The apparatus of claim 16, further comprising a passage that is between the member and the projection system and that is fluidly connected to the space.

* * * * *

UNITED STATES PATENT AND TRADEMARK OFFICE
CERTIFICATE OF CORRECTION

PATENT NO. : 8,810,771 B2  
APPLICATION NO. : 13/323404  
DATED : August 19, 2014  
INVENTOR(S) : Christiaan Alexander Hoogendam et al.

Page 1 of 1

It is certified that error appears in the above-identified patent and that said Letters Patent is hereby corrected as shown below:

On Title Page 2, Item (56) References Cited - Foreign Patent Documents, Line 34
replace "WO    0 605 103 A1    7/1994"
with --EP    0 605 103 A1    7/1994--.

Signed and Sealed this
Twenty-fifth Day of November, 2014

Michelle K. Lee
*Deputy Director of the United States Patent and Trademark Office*